US 6,690,247 B2

(12) United States Patent
Kintis et al.

(10) Patent No.: US 6,690,247 B2
(45) Date of Patent: *Feb. 10, 2004

(54) NONLINEAR TRANSMISSION LINE WAVEFORM GENERATOR HAVING AN INPUT VOLTAGE MATCHED TO THE C/V CHARACTERISTIC OF THE TRANSMISSION LINE

(75) Inventors: Mark Kintis, Manhattan Beach, CA (US); Daniel K. Ko, Monterey Park, CA (US); Flavia S. Fong, Buena Park, CA (US); Stephen A. Maas, Long Beach, CA (US)

(73) Assignee: Northrop Grumman Corporation, Los Angeles, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/245,609

(22) Filed: Feb. 5, 1999

(65) Prior Publication Data

US 2001/0011930 A1 Aug. 9, 2001

(51) Int. Cl.$^7$ ................................................. H03K 3/36
(52) U.S. Cl. ........................... 333/20; 307/106; 327/181
(58) Field of Search ........................... 333/20; 327/119, 327/164, 181; 307/106

(56) References Cited

U.S. PATENT DOCUMENTS 3,418,604 A  * 12/1968  Ross .............................. 333/20
5,014,018 A     5/1991  Rodwell et al. ............... 333/20

(List continued on next page.)

OTHER PUBLICATIONS

"GaAs Nonlinear Transmission Lines for Picosecond Pulse Generation and Millimeter–Wave Sampling" by mark J. W. Rodwell, pp. 1194–1204, IEEE MTT, Vol 39, No. 7, Jul. 2001.

Primary Examiner—Benny Lee
(74) Attorney, Agent, or Firm—Katten Muchin Zavis Rosenman; John S. Paniaguas

(57) ABSTRACT

A nonlinear transmission-line waveform generator for generating a comb of frequencies and relatively short duration pulses, for example, in the range of picoseconds and tens of picoseconds, that are adapted to being utilized with ultra wideband radios in order to improve the bandwidth of such radios by an order of magnitude, for example, up to tens and even hundreds of GHz. In particular, the nonlinear transmission line waveform generator in accordance with the present invention consists of a microstrip or coplanar waveguide line. In accordance with an important aspect of the invention, the $\Delta C/\Delta V$ characteristic of the nonlinear transmission line is matched to the frequency and amplitude of the input sinusoidal waveform. By matching the $\Delta C/\Delta V$ characteristics of the nonlinear transmission line to the input sinusoidal waveform, the output of the nonlinear transmission line produces a comb of frequencies that are multiples of the input sinusoidal waveform frequency, making it suitable as a harmonic generator. The nonlinear transmission line can also be used to generate relatively short duration pulses by disposing a shorting stub at the output. The shorting stub causes the waveform to be reflected 180° out of phase so that it cancels the trailing edge of the original output from the nonlinear transmission lines to form a short duration pulse in the picosecond range. The length of the stub determines the width of the resultant output pulse.

9 Claims, 1 Drawing Sheet

U.S. PATENT DOCUMENTS

| | | | |
|---|---|---|---|
| 5,023,574 A | 6/1991 | Anklam et al. | 333/20 |
| 5,157,361 A | 10/1992 | Gruchalla et al. | 333/20 |
| 5,208,560 A * | 5/1993 | Yasutake | 333/20 X |
| 5,256,996 A | 10/1993 | Marsland et al. | 333/20 |
| 5,274,271 A * | 12/1993 | McEwan | 333/20 X |
| 5,352,627 A | 10/1994 | Cooper | 437/105 |
| 5,352,994 A | 10/1994 | Black et al. | 333/33 |
| 5,396,198 A * | 3/1995 | Yamashita et al. | 333/20 X |
| 5,789,994 A | 8/1998 | Case et al. | 333/20 |
| 5,804,921 A * | 9/1998 | McEwan et al. | 333/20 |

* cited by examiner

NONLINEAR TRANSMISSION LINE WAVEFORM GENERATOR HAVING AN INPUT VOLTAGE MATCHED TO THE C/V CHARACTERISTIC OF THE TRANSMISSION LINE

BACKGROUND OF THE INVENTION

1. Field of the Invention

The present invention relates to a nonlinear transmission line waveform generator for use as a harmonic generator and for generating relatively short duration pulses, for example, in the picosecond range, and more particularly to a nonlinear transmission line waveform generator for producing relatively short duration narrow pulses which do not experience the problems associated with nonlinear transmission lines which include step recovery diodes, tunnel diodes or varactor diodes.

2. Description of the Prior Art

Nonlinear transmission lines are generally known in the art. Examples of such nonlinear transmission lines are disclosed in: "GaAs Nonlinear Transmission Lines for Picosecond Pulse Generation and Millimeter Wave Sampling", by Rodwell, et al., *IEEE Transactions on Microwave Theory and Techniques,* vol. 39, no. 7, July 1991, pages 1194–1204; U.S. Pat. Nos. 5,352,994; 5,352,627; 5,023,574; 5,256,996; 5,789,994; 5,014,018; and 5,157,361, all hereby incorporated by reference. Such nonlinear transmission lines are used in various applications, such as harmonic generators and generation of relatively short duration narrow pulses in the hundreds of picosecond range which provide increased bandwidth in certain applications, such as ultra wideband radio applications, also known as impulse radios. In particular, ultra wideband radios are generally known in the art. Examples of such ultra wideband radios are manufactured by Time Domain Corporation and Paulson Communication Corporation. Such ultra wideband radios utilize relatively short-duration pulses, for example, pulse widths in the hundreds of picoseconds. These short-duration pulses are pulse-position modulated, to increase the bandwidth of such radios up to, for example, 5 GHz. Unfortunately, there is an ever increasing demand to further increase the bandwidth of such impulse radios as well as other microwave devices. The bandwidth of such ultra-wideband radios is limited by the current technology in which the shortest duration pulses which can be generated are in the hundreds of picoseconds. Thus, there is a need to provide a system for generating pulses having pulse widths less than the hundreds of picoseconds in duration.

Moreover, some known methods for fabricating nonlinear transmission lines are complicated by the need for step recovery diodes, tunnel diodes or varactor diodes. More particularly, standard transmission lines are known to be modeled as a distributed network of series inductances L and shunt capacitances C. In nonlinear transmission lines, the shunt capacitances C are replaced with varactor diodes, step recovery diodes or tunnel diodes, all of which are known to cause several problems. First, such devices complicate monolithic fabrication. Also, such devices are known to become unstable and oscillate. Thus, a need has developed for simpler, less complicated devices that are also more stable than known nonlinear transmission lines.

SUMMARY OF THE INVENTION

Briefly, the present invention relates to a nonlinear transmission waveform generator for line for generating a comb of frequencies and relatively short duration pulses, for example, in the range of picoseconds and tens of picoseconds, that are adapted to being utilized with ultra-wideband radios in order to improve the bandwidth of such radios by an order of magnitude, for example, up to tens and even hundreds of GHz. In particular, the nonlinear transmission line waveform generator in accordance with the present invention consists of a microstrip or coplanar waveguide line. In accordance with an important aspect of the invention, the C/V characteristic of the nonlinear transmission line is matched to the frequency and amplitude of the input sinusoid. By matching the C/V characteristics of the nonlinear transmission line to the input sinusoid, the output of the nonlinear transmission line produces a comb of frequencies that are multiples of the input sinusoid frequency, making it suitable as a harmonic generator. The nonlinear transmission line can also be used to generate relatively short-duration pulses by employing a shorting stub at the output. The shorting stub causes the waveform to be reflected 180° out of phase, so that it cancels the trailing edge of the original output from the nonlinear transmission lines to form a short duration pulse in the picosecond range. The length of the stub determines the width of the resultant output pulse.

DESCRIPTION OF THE DRAWINGS

These and other advantages of the present invention will be readily understood with reference to the following drawing and specification wherein.

DETAILED DESCRIPTION

The present invention relates to a nonlinear transmission line waveform generator which can be used for various purposes. As will be discussed in more detail below, in accordance with one aspect of the invention, the nonlinear transmission-line waveform generator can be used to generate a comb of harmonic frequencies that are multiples of the input sinusoidal frequencies. Such comb generators are known to be used in frequency multipliers, for example, at millimeter wave frequencies, frequency synthesizers and harmonic generators. In accordance with another aspect of the invention, the nonlinear transmission-line waveform generator in accordance with the present invention is also adapted to generate relatively short duration pulses for use in various applications, including true-time-delay phase-shifter applications for phased array antennas, sampling oscilloscopes, network analyzers, counters, sampling down-converting mixers, high-speed analog-to-digital converters and very narrow pulsed ultra-wideband impulse radios. As discussed above, the waveform generator in accordance with the present invention is adapted to provide relatively short-duration pulse widths in the picosecond and tens of picoseconds range which can be used to improve the bandwidth of ultra-wideband radios to the tens of GHz or even up to the hundreds of GHz. Known impulse radios have bandwidths less than 10 GHz.

Figure 1:
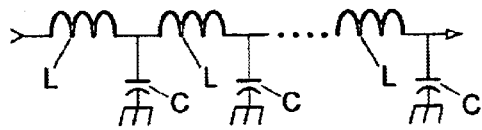
FIG. 1 is a schematic diagram of a standard transmission line model.

Referring to FIG. 1, a standard transmission line is shown modeled as a distributed network of series inductances L and shunt capacitances C. In order to form a nonlinear transmission line, the shunt capacitances C are replaced with diodes, for example, back biased Schottky diodes. As mentioned above, such nonlinear transmission lines are known in the art and are disclosed, for example in U.S. Pat. Nos. 5,014,018; 5,023,574; 5,157,361; 5,256,996; 5,352,627; 5,352,994; and 5,789,994.

Such nonlinear transmission lines can be formed from a microstrip line or a coplanar waveguide as generally known in the art. The transmission line can also be formed as a microwave monolithic integrated circuit (MMIC), for example, as disclosed in U.S. Pat. No. 5,014,018, hereby incorporated by reference. As mentioned above, with reference to FIG. 1, the shunt capacitances C are replaced with back biased Schottky diodes. The Schottky diodes are formed as hyper-abrupt junction diodes as is known in the art so that their capacitance changes with the applied voltage for example, as close to $1/V^2$ as possible so that the greater the bias voltage the lesser the capacitance. As such, the nonlinear transmission line will have a varactor like characteristics in which the change in capacitance $\Delta C$ is inversely proportional to their change in applied voltage $\Delta V$.

Figure 2:
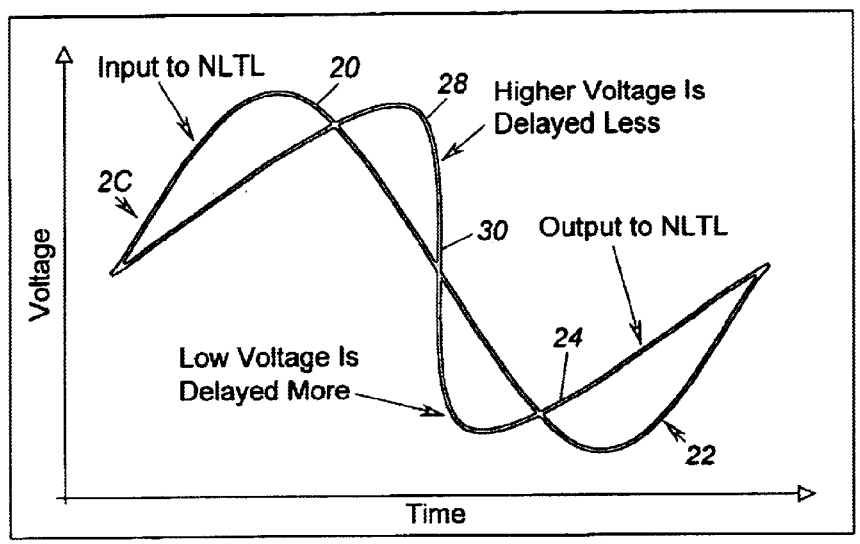
FIG. 2 is a graphical illustration of the input and output waveforms of the nonlinear waveform generator in accordance with the present invention.

In accordance with one aspect of the invention, the nonlinear transmission line waveform generator functions as a comb generator. In this embodiment, the C/V characteristic of the nonlinear transmission line is matched to the frequency and amplitude of the input sinusoid so that the range of the capacitance variation is the same as the peak-to-peak voltage on the transmission line. More particularly, referring to FIG. 2, a relatively large sinusoidal waveform is applied to the input of the nonlinear transmission line, as identified with the reference numeral 20. By selecting a relatively large amplitude sinusoidal signal whose characteristics are matched to the C/V characteristics of the nonlinear transmission lines, the output of the nonlinear transmission line will have a spectrum consisting of a large number of harmonics of the input sinusoidal frequency. More particularly, referring to FIG. 2, when a large voltage signal is applied to the nonlinear transmission line, the lower part of the waveform, for example, the portion as generally identified with the reference numeral 22, is exposed to a relatively larger capacitance and hence a longer delay as indicated by the segment, generally identified with the reference numeral 24. Similarly, the upper voltage portion of the waveform, generally indicated with the reference numeral 26, is exposed to a relatively smaller capacitance and hence a shorter delay, as indicated by the portion identified with the reference numeral 28. As such, by applying a relatively large sinusoidal voltage to the nonlinear transmission line whose C/V characteristics are matched to the frequency and amplitude of the input sinusoid, the output signal, as indicated in FIG. 2, will be distorted by the nonlinear transmission line so that it has a relatively slow rise time as indicated by the line segment 28 and a relatively steep fall time, as indicated by the segment 30. As such, the spectrum of the output signal will be a comb of frequencies, all multiples of the sinusoidal frequency of the input signal.

Figure 3:
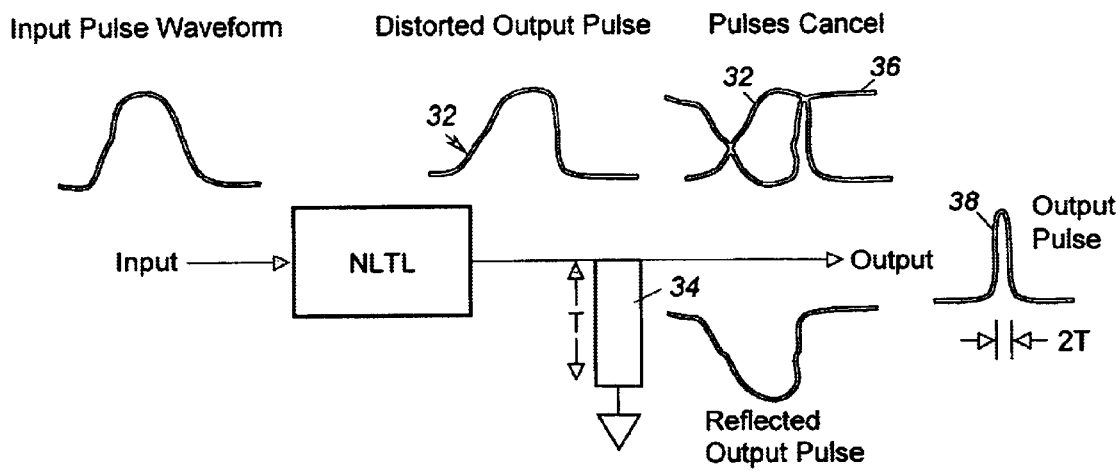
FIG. 3 is a block diagram of a nonlinear transmission line waveform generator in accordance with the present invention.

Another important aspect of the invention is illustrated in FIG. 3. In particular, FIG. 3 illustrates a nonlinear transmission line waveform generator that is adapted to generate relatively narrow short duration pulses in the order of picoseconds which can be used for various purposes including improving the bandwidth of ultra wideband radios to tens and even hundreds of GHz. Referring to FIG. 3, an input waveform is applied to the nonlinear transmission line as discussed above. In particular, a relatively large amplitude sinusoidal input voltage is used as an input waveform whose characteristics are matched to the C/V characteristics of the nonlinear transmission line. As discussed above, by matching the C/V characteristics to the existing fall time of the input waveform, the output waveform from the nonlinear transmission line will have a degraded rising edge and extremely sharp falling edge as indicated by the waveform 32 in FIG. 3. In order to generate a relatively narrow short duration pulse, a shorting stub 34 or transmission line is disposed at the output of the nonlinear transmission line in a shunt configuration as generally shown in FIG. 3. The shorting stub 34 causes the output waveform from the nonlinear transmission line to be reflected back at 180° out of phase as indicated by the waveform 36, so that it cancels the trailing edge of the waveform 32, resulting in a relatively narrow pulse width resultant pulse as indicated by the waveform 38. The length (T) of the stub 34 determines the width (2T) of the resultant pulse; the width is twice the time delay of the stub length. In other words, if the stub transmission line is 50 picoseconds long, the resultant pulse will be, for example, 100 picoseconds long with relatively sharp leading and falling edges. The output pulses 38 may be as short as picoseconds or tens of picoseconds by varying the dimensions of stub.

The embodiment illustrated in FIG. 3, in addition to generating relatively narrow short duration pulses, is also adapted to be used as a harmonic generator. The relatively narrow pulse 38 generated by the embodiment illustrated in FIG. 3 is even richer in harmonics than the waveform 32. In some applications, a fairly narrow band of output frequencies may be desired from the harmonic generators (e.g. 19th, 20th, 21st, and 22nd harmonic). In such applications, the output stub or even a more complex resonant circuit can be tuned to the center of the output band enhancing the desired signals and reflecting the out of band energy back into the nonlinear transmission line to decrease the signal attenuation of the circuit.

Obviously, many modifications and variations of the present invention are possible in light of the above teachings. Thus, it is to be understood that, within the scope of the appended claims, the invention may be practiced otherwise than as specifically described above.

What is claimed and desired to be covered by a Letters Patent is as follows:

We claim:

1. A method for generating a waveform, the method comprising the steps of:
   (a) providing a nonlinear transmission line having an input, an output and a plurality of shunt diodes connected between said nonlinear transmission line and ground defining a predetermined capacitance/voltage (CV) characteristic for said nonlinear transmission line; and
   (b) applying a sinusoidal input waveform to said nonlinear transmission line in which the amplitude and frequency of said sinusoidal input waveform are matched to said C/V characteristic of said nonlinear transmission line to generate a plurality of output signals having comb of frequencies that are multiples of the frequency of the input sinusoidal input waveform.

2. The method as recited in claim 1, wherein said nonlinear transmission line includes a microstrip.

3. The method as recited in claim 1, wherein said nonlinear transmission line includes a coplanar waveguide.

4. A signal generator comprising:
   a transmission line having an input and an output;
   a plurality of diodes connected between said transmission line and ground thereby forming a nonlinear transmission line having a predetermined capacitance/voltage characteristic;

means for receiving an input waveform in which the amplitude and frequency is matched to the capacitance/voltage characteristic of said nonlinear transmission line and coupling said input waveform to said input of said nonlinear transmission line; and a shorting stub disposed at the output of said nonlinear transmission line.

5. A method for generating a waveform, the method comprising the steps of:

(a) providing a nonlinear transmission line having an input, an output and a plurality of shunt diodes connected between said nonlinear transmission line and ground defining a predetermined capacitance/voltage characteristic for said nonlinear transmission line;

(b) applying a input voltage to said nonlinear transmission line, said input voltage having an amplitude and frequency matched to the capacitance/voltage characteristic of said nonlinear transmission line; and (c) disposing a stub at the output of said nonlinear transmission line, said stub coupled between said output and ground, the length of said stub determining the width of said resultant output pulse.

6. A signal generator comprising:

a nonlinear transmission line having an input, an output and a plurality of diodes connected between said transmission line and ground forming a nonlinear transmission line having a predetermined capacitance/voltage characteristic;

means for receiving a sinusoidal input waveform and coupling said sinusoidal input waveform and said of said nonlinear transmission, wherein the frequency and amplitude of said sinusoidal input waveform are selected to match the capacitance/voltage characteristic of said nonlinear transmission line to generate a plurality of output signals having a comb of frequencies that are multiples of the sinusoidal input waveform frequency.

7. The signal generator as recited in claim 6, wherein said nonlinear transmission line includes a microstrip.

8. The signal generator as recited in claim 6, wherein said nonlinear transmission line includes a coplanar waveguide.

9. A signal generator comprising:

a transmission line having an input and an output;

a plurality of shunt diodes connected between said transmission line and ground thereby forming a nonlinear transmission line having a predetermined capacitance/voltage characteristic;

means for receiving an input waveform in which the frequency and amplitude are matched to the capacitance/voltage characteristic of said nonlinear transmission line and coupling said input waveform to said input of said nonlinear transmission line;

a shorting stub having a predetermined width, coupled to the output of said nonlinear transmission line for causing a reflected pulse having, a pulse width which is a function of said predetermined width which cancels a portion of the output pulse which is a function of said predetermined width at the output of the nonlinear transmission line to provide a resultant pulse having a pulse width less than the pulse width of said output pulse.

* * * * *